US009397166B2

(12) United States Patent
Le et al.

(10) Patent No.: US 9,397,166 B2
(45) Date of Patent: Jul. 19, 2016

(54) STRAINED CHANNEL REGION TRANSISTORS EMPLOYING SOURCE AND DRAIN STRESSORS AND SYSTEMS INCLUDING THE SAME

(75) Inventors: Van H. Le, Portland, OR (US); Harold W. Kennel, Portland, OR (US); Willy Rachmady, Beaverton, OR (US); Ravi Pillarisetty, Portland, OR (US); Jack Kavalieros, Portland, OR (US); Niloy Mukherjee, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/977,394

(22) PCT Filed: Dec. 20, 2011

(86) PCT No.: PCT/US2011/066133
§ 371 (c)(1),
(2), (4) Date: Jun. 28, 2013

(87) PCT Pub. No.: WO2013/095376
PCT Pub. Date: Jun. 27, 2013

(65) Prior Publication Data
US 2013/0285017 A1    Oct. 31, 2013

(51) Int. Cl.
*H01L 29/06* (2006.01)
*H01L 29/20* (2006.01)
(Continued)

(52) U.S. Cl.
CPC .......... *H01L 29/20* (2013.01); *H01L 29/42392* (2013.01); *H01L 29/775* (2013.01);
(Continued)

(58) Field of Classification Search
CPC ............ H01L 29/0665; H01L 29/0673; H01L 29/1606; H01L 29/205; H01L 29/2003; H01L 29/66462; H01L 29/7787; H01L 29/7783; H01L 29/802
USPC ................................................... 257/27, 192
See application file for complete search history.

(56) References Cited

U.S. PATENT DOCUMENTS 7,098,477 B2    8/2006  Doris et al.
7,470,972 B2   12/2008  Kavalieros et al.
(Continued)

FOREIGN PATENT DOCUMENTS

TW    M412443 U       9/2011
WO    2008/034850 A2  3/2008
WO    2013/095376 A1  6/2013

OTHER PUBLICATIONS

International Preliminary Report on Patentability and Written opinion received for PCT Application No. PCT/US2011/066133, mailed on Jul. 3, 2014, 6 pages.
(Continued)

*Primary Examiner* — Monica D Harrison
(74) *Attorney, Agent, or Firm* — Patent Capital Group

(57) ABSTRACT

Embodiments of the present invention provide transistor structures having strained channel regions. Strain is created through lattice mismatches in the source and drain regions relative to the channel region of the transistor. In embodiments of the invention, the transistor channel regions are comprised of germanium, silicon, a combination of germanium and silicon, or a combination of germanium, silicon, and tin and the source and drain regions are comprised of a doped III-V compound semiconductor material. Embodiments of the invention are useful in a variety of transistor structures, such as, for example, trigate, bigate, and single gate transistors and transistors having a channel region comprised of nanowires or nanoribbons.

26 Claims, 8 Drawing Sheets

(51) Int. Cl.
  *H01L 29/78* (2006.01)
  *H01L 29/423* (2006.01)
  *H01L 29/786* (2006.01)
  *H01L 29/775* (2006.01)
  *B82Y 99/00* (2011.01)

(52) U.S. Cl.
  CPC .......... *H01L29/785* (2013.01); *H01L 29/7848* (2013.01); *H01L 29/78696* (2013.01); *B82Y 99/00* (2013.01); *H01L 29/0673* (2013.01); *Y10S 977/762* (2013.01)

(56) References Cited

U.S. PATENT DOCUMENTS

| | | | |
|---|---|---|---|
| 7,485,503 B2 | 2/2009 | Blackwell et al. | |
| 7,569,869 B2 | 8/2009 | Chau et al. | |
| 7,592,213 B2 | 9/2009 | Datta et al. | |
| 7,629,603 B2 | 12/2009 | Chui et al. | |
| 7,709,312 B2 | 5/2010 | Doyle et al. | |
| 7,825,400 B2 | 11/2010 | Datta et al. | |
| 7,863,710 B2 | 1/2011 | Hudait et al. | |
| 7,902,058 B2 | 3/2011 | Brask et al. | |
| 7,989,280 B2 | 8/2011 | Blackwell et al. | |
| 8,120,065 B2 | 2/2012 | Brask et al. | |
| 8,129,795 B2 | 3/2012 | Brask et al. | |
| 8,283,653 B2 * | 10/2012 | Pillarisetty et al. | 257/20 |
| 8,288,233 B2 | 10/2012 | Jin et al. | |
| 8,421,059 B2 | 4/2013 | Datta et al. | |
| 8,530,884 B2 | 9/2013 | Datta et al. | |
| 2004/0227181 A1 | 11/2004 | Choe et al. | |
| 2006/0237801 A1 | 10/2006 | Brask et al. | |
| 2006/0292776 A1 | 12/2006 | Brask et al. | |
| 2008/0132081 A1 | 6/2008 | Barns et al. | |
| 2009/0075029 A1 | 3/2009 | Thomas et al. | |
| 2009/0075445 A1 | 3/2009 | Kavalieros et al. | |
| 2011/0049613 A1 | 3/2011 | Yeh et al. | |
| 2012/0074464 A1 | 3/2012 | Cea et al. | |
| 2012/0091469 A1 * | 4/2012 | Park et al. | 257/77 |
| 2012/0248502 A1 * | 10/2012 | Cheng et al. | 257/192 |

OTHER PUBLICATIONS

Hock-Chun Chin et al. "Strained In0.53Ga0.47As n-MOSFETS: Performance Boost with in-situ Doped Lattice-Mismatched Source/Drain Stressors and Interface Engineering," Symposium on VLSI Technology Digest of Technical Paper IEEE, 2009, 244-245.

International Search Report and Written Opinion received for International Application No. PCT/US2011/066133, mailed on Aug. 31, 2012, 11 pages.

Office Action Received for Taiwanese Patent Application No. 101147880 mailed on Oct. 3, 2014, 16 pages of Office Action and 13 pages of English Translation.

Lin, Ting-Yu, Academic Thesis, "Silicon Nanowire Field Effect Transistor," Aug. 5, 2009, 16 pages.

Office Action Received for Taiwanese Patent Application No. 101147880 mailed on Feb. 12, 2015, 15 pages of Office Action and 12 pages of English Translation.

Office Action Received for Korean Patent Application No. 10-2014-7017978 mailed on Aug. 16, 2015, 6 pages of Office Action and 2 pages of English Translation.

Notice of Final Rejection from the Korean Intellectual Property Office in Korean Patent Application No. 10-2014-7017978 mailed Feb. 4, 2016.

* cited by examiner

STRAINED CHANNEL REGION TRANSISTORS EMPLOYING SOURCE AND DRAIN STRESSORS AND SYSTEMS INCLUDING THE SAME

BACKGROUND OF THE INVENTION

1. Field of the Invention

Embodiments of the invention relate generally to integrated circuits, semiconductor devices, transistors, single and multigate transistors, and nanoribbon and nanowire transistors.

2. Background Information

The push toward ever-smaller more highly integrated circuit (IC) and other semiconductor devices places enormous demands on the techniques and materials used to construct the devices. In general, an IC chip is also known as a microchip, a silicon chip, or a chip. Integrated circuit chips are found in a variety of common devices, such as the processors in computers, cars, televisions, CD players, and cellular phones. A plurality of IC chips are typically built on a silicon wafer (a thin silicon disk, having a diameter, for example, of 300 mm) and after processing the wafer is diced apart to create individual chips. A 1 cm$^2$ IC chip having feature sizes around of about 90 nm can comprise hundreds of millions of components. Current technologies are pushing feature sizes even smaller than 45 nm. Components of IC chips include, for example, transistors such as CMOS (complementary metal-oxide-semiconductor) devices, capacitive structures, resistive structures, and metal lines that provide electronic connections between components and external devices.

DETAILED DESCRIPTION OF THE INVENTION

Embodiments of the present invention provide transistor structures having strained channel regions. Transistors having source and drain regions comprised of materials that create stress in the transistor channel region are provided. In embodiments of the invention transistor source and drain regions can be comprised of doped materials that comprise elements from groups IIIA and VA of the periodic table (doped III-V compound semiconductor materials). In embodiments of the invention, the transistor channel regions can be comprised of germanium, silicon, combinations of germanium and silicon, or combinations of germanium, silicon, and or tin (such as, Ge$_x$Si$_y$Sn$_{1-x-y}$). Embodiments of the invention are useful in a variety of transistor structures, such as, for example, frigate, bigate, and single gate transistors and transistors having a channel region comprised of nanoribbons or nanowires.

In general, the mobility of carriers (holes and electrons) in a CMOS transistor's channel region can be affected by the material composition of and strain (tensile or compressive) in the channel region. For PMOS (p-channel metal oxide semiconductor) transistor devices, channel regions having uniaxial compressive strain can provide increased drive current for a given design voltage and gate length over transistor channel regions not exhibiting compressive strain. For NMOS (n-channel metal oxide semiconductor) transistor devices, channel regions having uniaxial tensile strain can provide increased drive current for a given design voltage and gate length over transistor channel regions not exhibiting tensile strain. Source and drain regions comprising materials with crystal lattice constants that are larger than that of the channel region can create compressive strain in the channel region of the PMOS transistor and source and drain regions comprising materials with crystal lattice constants that are smaller than that of the channel region can create tensile strain in the channel region of the NMOS transistor.

Figure 1:
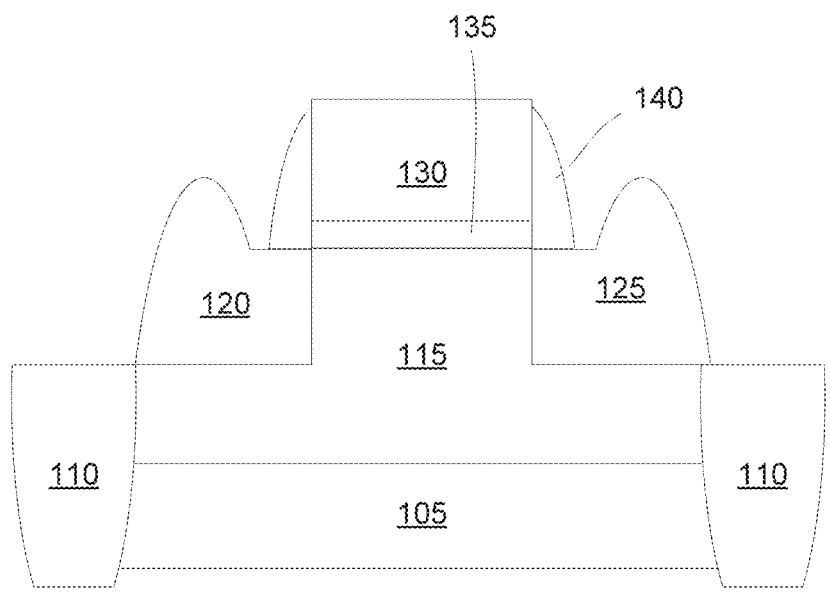
FIG. 1 is a schematic diagram illustrating a single gate transistor structure.

FIG. 1 illustrates a single gate transistor structure having a strained channel region. Other structures are also possible for single gate transistors, such as, ones having features that are differently oriented relative to one another and structures having features with different shapes and or sizes. For example, single gate transistor structures having source and drain regions that are not recessed relative to the channel region are also possible. In FIG. 1, a substrate 105 has proximate isolation trenches 110 and houses a channel region 115. Isolation trenches 110 are comprised of an insulating material and can electrically isolate the transistor structure from other devices that make up the semiconductor chip. In embodiments of the invention, the substrate 105 comprises, for example, silicon, germanium, Si$_x$Ge$_{1-x}$, silicon on insulator, germanium on insulator, or III-V compound materials (materials comprising elements from groups IIIA and VA of the periodic table). In embodiments of the invention, the channel region 115 comprises germanium, silicon, combinations of germanium and silicon, or combinations of germanium, silicon, and or tin (such as, for example, Ge$_x$Si$_y$Sn$_{1-x-y}$). The channel region 115 can be doped or undoped. In embodiments of the invention, doping concentrations range from 1e16 to 1e20 atoms/cm$^3$. Source and drain regions 120 and 125 create compressive or tensile strain in the channel region 115 and are comprised of material that has a lattice constant that is larger or smaller (respectively) with respect to the channel. In embodiments of the invention, source and drain regions 120 and 125 are comprised of a doped III-V compound semiconductor material (a material comprising elements from group IIIA and group VA of the periodic table). In embodiments of the invention, dopants include germanium, carbon, silicon, magnesium, beryllium, manganese, and or zinc. Other dopants are also possible. Gate electrode region 130 is on one side of the channel region 115 and is separated from the channel region 115 by a gate dielectric region 135. Optional insulating spacers 140 are formed during device manufacture to facilitate manufacture and serve to electrically isolate the transistor gate region.

Figure 2A:
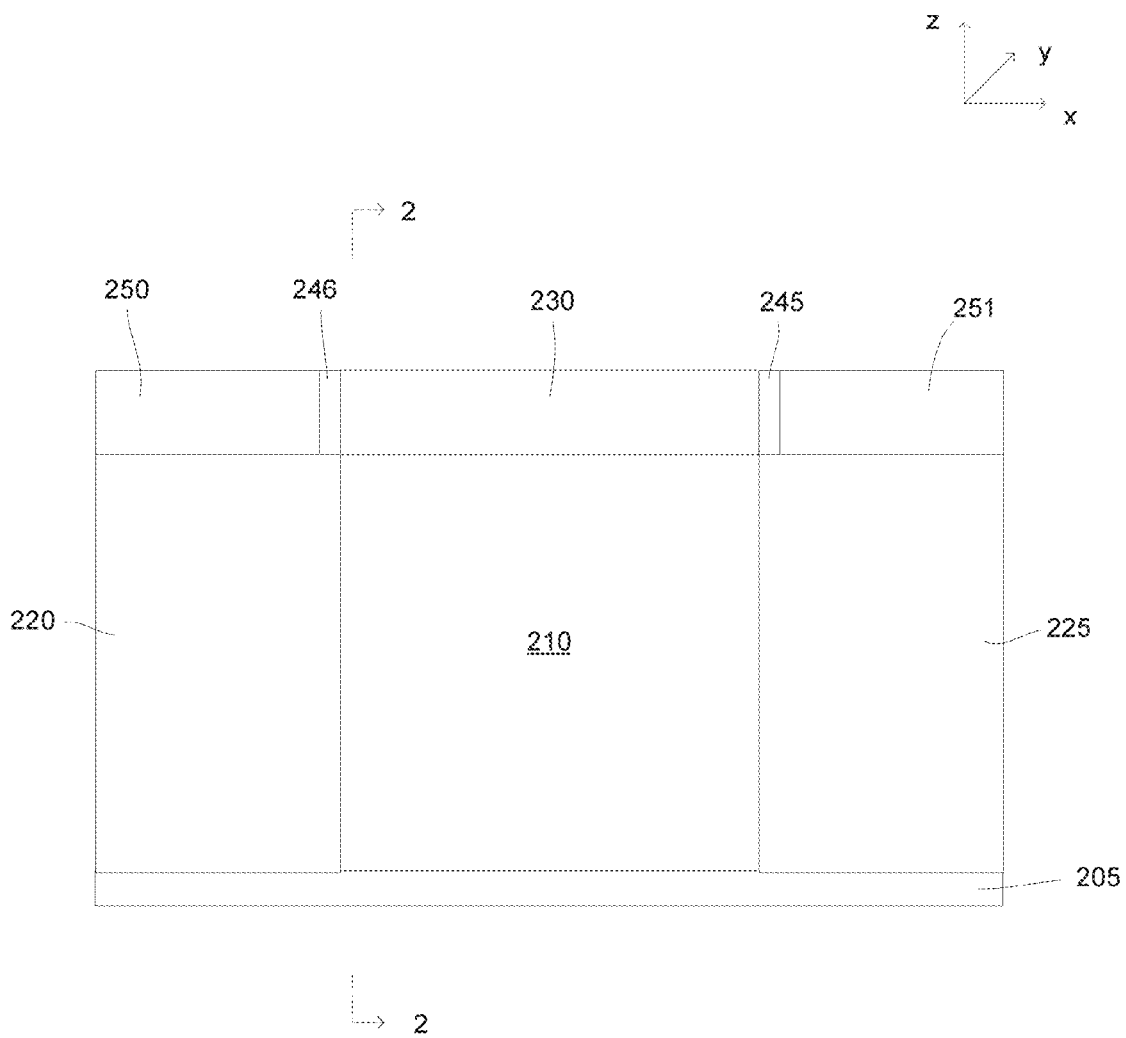
FIGS. 2A-B are schematic diagrams illustrating cross-sectional views of a bigate transistor structure.
Figure 2B:
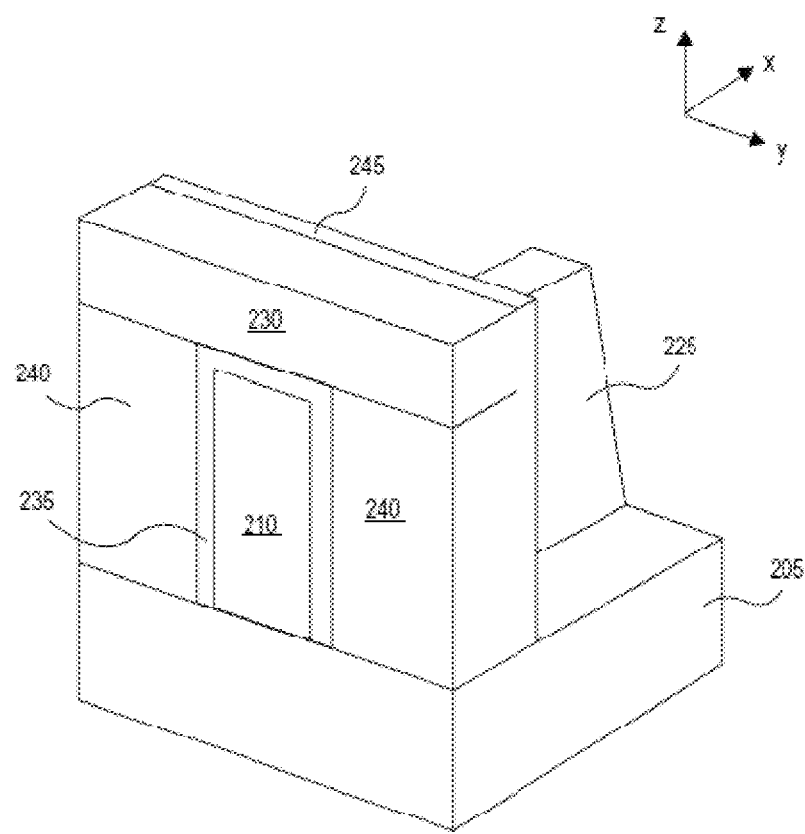

FIGS. 2A-B show a bigate transistor structure having a strained channel region. FIG. 2B represents a view along 2-2 of the structure of FIG. 2A rotated by 45°. In FIGS. 2A-B, a substrate 205 houses a channel region 210. In embodiments of the invention, the channel region 210 is comprised of germanium, silicon, combinations of germanium and silicon, or combinations of germanium, silicon, and or tin (such as, for example, Ge$_x$Si$_y$Sn$_{1-x-y}$). The channel region 115 can be doped or undoped. In embodiments of the invention, doping concentrations range from 1e16 to 1e20 atoms/cm$^3$. The substrate 205 is comprised of, for example, silicon, germanium, Si$_x$Ge$_{1-x}$, silicon on insulator, germanium on insulator, or III-V compound materials. Source and drain regions 220 and 225 abut ends of the channel region 210. Source and drain regions 220 and 225 create compressive or tensile strain in the channel region and are comprised of material that has a lattice constant that is larger or smaller (respectively) than that of the channel region. In embodiments of the invention, source and drain regions 220 and 225 are comprised of a doped III-V compound semiconductor material (a material comprising elements from group IIIA and group VA of the periodic table). In embodiments of the invention, dopants include germanium, carbon, silicon, magnesium, beryllium, manganese, and or zinc. Other dopants are also possible. An insulating region 230 is disposed on a side of channel region 210.

In FIG. 2B, the bigate transistor structure additionally comprises a gate dielectric 235 and a gate electrode 240. The gate dielectric 235 is disposed on two opposing sides of the channel region 210. The gate electrode 240 is disposed on the gate dielectric 235. Optionally, insulating spacers 245 and 246 abut the gate dielectric 235 and the gate electrode 240. The transistor structure is typically covered in an insulating dielectric layer, which is partially shown as insulating regions 250 and 251.

Figure 3A:
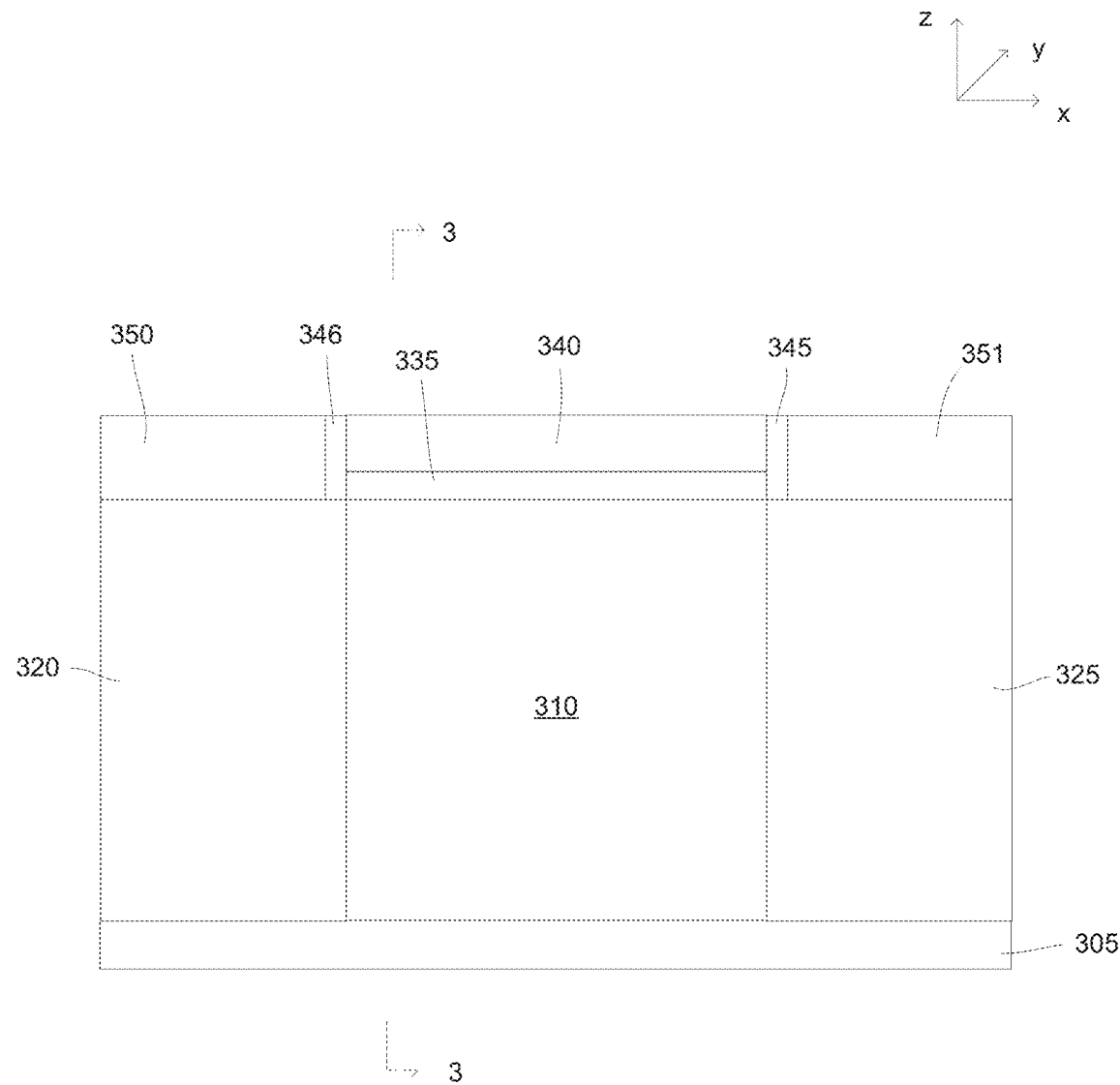
FIGS. 3A-B are schematic diagrams illustrating cross-sectional views of a trigate transistor structure.
Figure 3B:
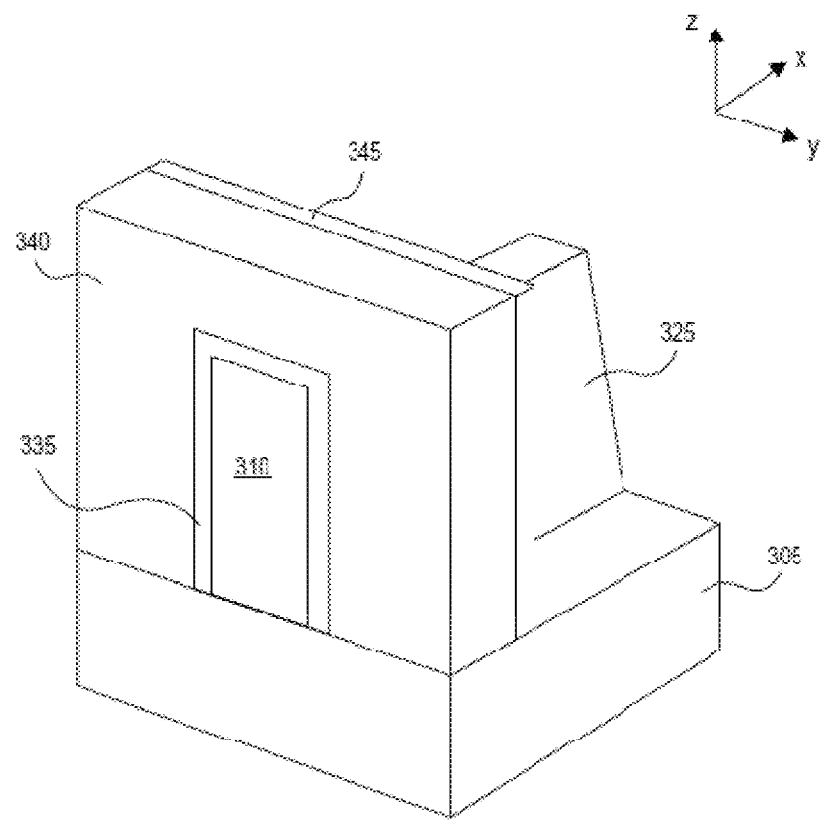

FIGS. 3A-B show a frigate transistor structure having a strained channel region. FIG. 3B represents a view along 3-3 of the structure of FIG. 3A rotated by 45°. In FIGS. 3A-B, a substrate 305 houses a channel region 310. In embodiments of the invention, the channel region 310 is comprised of germanium, silicon, combinations of germanium and silicon, or combinations of germanium, silicon, and or tin (such as, for example, $Ge_xSi_ySn_{1-x-y}$). The substrate 305 is comprised of, for example, silicon, germanium, $Si_xGe_{1-x}$, silicon on insulator, germanium on insulator, or III-V compound materials. Source and drain regions 320 and 325 abut ends of the channel region 310. Source and drain regions 320 and 325 create compressive or tensile strain in the channel region and are comprised of material that has a lattice constant that is larger or smaller (respectively) than that of the channel region. In embodiments of the invention, source and drain regions 320 and 325 are comprised of a doped III-V compound semiconductor material (a material comprising elements from group IIIA and group VA of the periodic table). In embodiments of the invention, dopants include germanium, carbon, silicon, magnesium, beryllium, manganese, and or zinc. Other dopants are also possible.

The trigate transistor structure additionally comprises a gate dielectric 335 and a gate electrode 340. The gate dielectric 335 is disposed on three sides of the channel region. The gate electrode 340 is disposed on the gate dielectric 335. Optionally, insulating spacers 345 and 346 abut the gate dielectric 335 and the gate electrode 340. The transistor structure is typically covered in an insulating dielectric layer, which is partially shown as insulating regions 350 and 351.

Figure 4A:
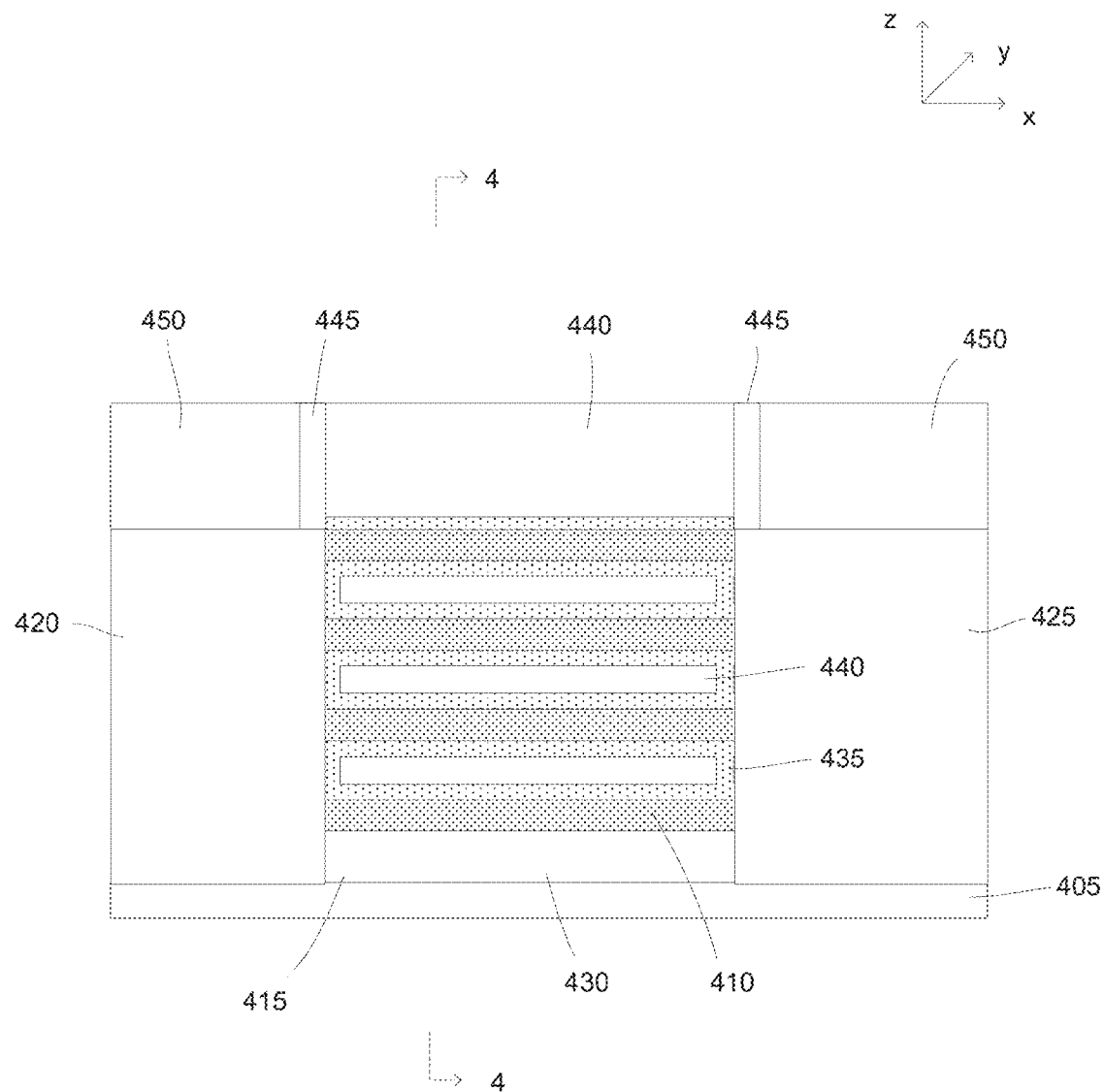
FIGS. 4A-B are schematic diagrams illustrating cross-sectional views of a transistor structure comprising nanowires or nanoribbons in the channel region.
Figure 4B:
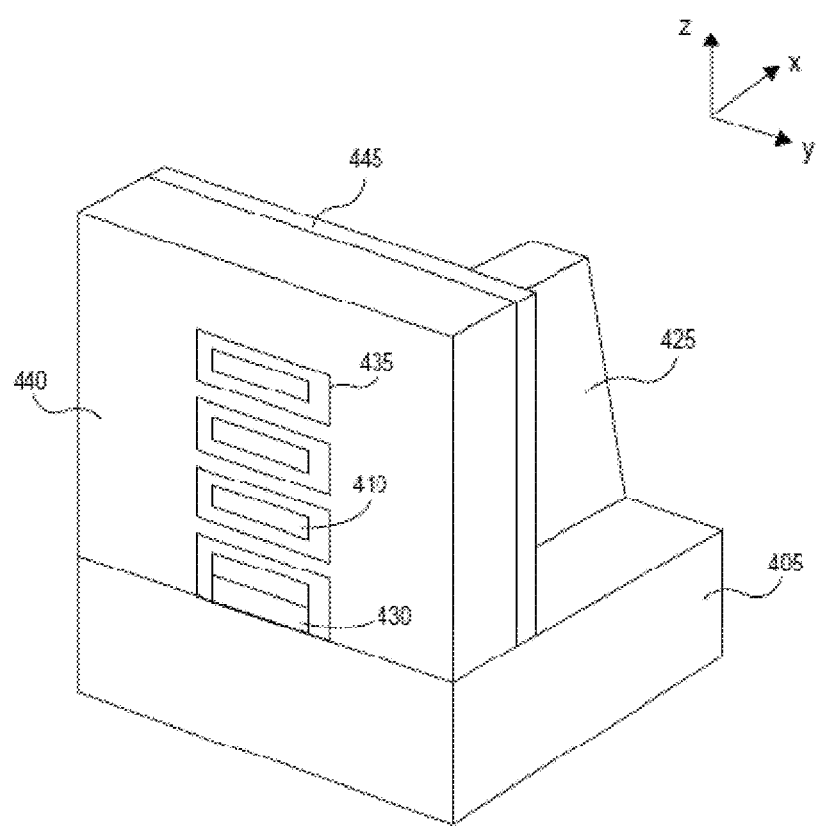

FIGS. 4A-B show transistor structures having strained nanoribbon or nanowire channel regions. In general, a nanowire can be considered to have widths and heights that are approximately equal, and nanoribbons can be considered to have a width that is larger than the height (the length dimension being the dimension along the length of the wire or ribbon). FIG. 4B represents a view along 4-4 of the structure of FIG. 4A rotated by 45°. In FIGS. 4A-B, substrate 405 and a channel region comprised of strained nanoribbons or nanowires 410 are provided. The substrate 405 is comprised of, for example, silicon, germanium, $Si_xGe_{1-x}$, silicon on insulator, germanium on insulator, or III-V compound materials. In embodiments of the invention, the nanowires 410 are comprised of germanium, silicon, combinations of germanium and silicon, or combinations of germanium, silicon, and or tin (such as, for example, $Ge_xSi_ySn_{1-x-y}$). Although four nanoribbons or nanowires 410 are shown in FIGS. 4A-B, other numbers of nanoribbons or nanowires 410 are possible, such as, between and including 1 and 8 of nanoribbons or nanowires in a transistor. Other numbers of nanoribbons or nanowires 410 are also possible, such as more than 8 nanoribbons or nanowires 410.

In FIG. 4A, source and drain regions 420 and 425 abut the ends of the nanoribbons or nanowires 410. Source and drain regions 420 and 425 create compressive or tensile strain in the nanowires or nanoribbons 410 and are comprised of material that has a lattice constant that is larger or smaller (respectively) than that of the channel region. In embodiments of the invention, source and drain regions 420 and 425 are comprised of a doped III-V compound semiconductor material (a material comprising elements from group IIIA and group VA of the periodic table). In embodiments of the invention, dopants include germanium, carbon, silicon, magnesium, beryllium, manganese, and or zinc. Other dopants are also possible. In FIGS. 4A-B, the transistor structure additionally comprises a gate dielectric 435 and a gate electrode 440. The gate dielectric 435 is disposed on the nanoribbons or nanowires 410. The gate electrode 440 is disposed on the gate dielectric 435. The gate dielectric 435 and the gate electrode 440 surround the nanoribbons or nanowires 410 in a way that can be described as all-around or 360°. Optionally, insulating spacers 445 abut the gate dielectric 435 and the gate electrode 440. The transistor structure is typically covered in an insulating dielectric layer, which is partially shown as insulating regions 450.

The source and drain regions described with respect to embodiments of the invention, 120, 125, 220, 225, 320, 325, 420, and 425 (FIGS. 1A-B through FIGS. 4A-B) are comprised of a doped III-V compound semiconductor material. In further embodiments of the invention, the source and drain regions 120, 125, 220, 225, 320, 325, 420 and 425 are comprised of at least one element from the group: B, Al, Ga, and or In and at least one element from the group: P, As, and or Sb. In additional embodiments, the source and drain regions 120, 125, 220, 225, 320, 325, 420, and 425 are comprised a compound material that has least one element from group IIIA of the periodic table and at least one element from group VA of the periodic table. In embodiments of the invention, the source and drain regions 120, 125, 220, 225, 320, 325, 420 and 425 can comprise a III-V ternary alloy (a mixture of 3 elements) or a III-V quaternary alloy (a mixture of four elements). In embodiments of the invention, the lattice strain mismatch of the source and drain regions 120, 125, 220, 225, 320, 325, 420, and 425 with respect to the channel region is anywhere from 1% to 2% although other values are also possible. In embodiments of the invention, source and drain regions 120, 125, 220, 225, 320, 325, 420, and 425 having tensile strain are comprised of $Al_xIn_{1-x}P$, where $0.5<x<0.8$, $Ga_xIn_{1-x}P$, where $0.5<x<0.8$, $GaSb_xP_{1-x}$, where $0.1<x<0.3$, $AlSb_xP_{1-x}$, where $0.1<x<0.3$, $AlAs_xP_{1-x}$, where $0.5<x<1$, or $GaAs_xP_{1-x}$, where $0.5<x<1$. In further embodiments of the invention, source and drain regions 120, 125, 220, 225, 320, 325, 420, and 425 having compressive strain are comprised of $Al_xIn_{1-x}P$, where $0.2<x<0.5$, $Ga_xIn_{1-x}P$, where $0.2<x<0.5$, $Ga_xIn_{1-x}$, As, where $0.7<x<1$, $Al_xIn_{1-x}P$, where $0.7<x<1$, $GaSb_xP_{1-x}$, where $0.3<x<0.5$, $AlSb_xP_{1-x}$, where $0.3<x<0.5$, $GaAs_xSb_{1-x}$, where $0.75<x<1$, or $AlAs_xSb_{1-x}$, where $0.75<x<1$. In embodiments of the invention, dopants for source and drain regions include germanium, carbon, silicon, magnesium, beryllium, manganese, and or zinc. In general, a dopant concentration in the source and drain regions 120, 125, 220, 225, 320, 325, 420, and 425 can be between 5e19 and 5e21 atoms/cm$^3$.

Typical dielectric materials used for dielectric layers, features, and or interlayer dielectrics (ILD) include silicon dioxide and low-k dielectric materials. Dielectric materials that may be used include, for example, carbon doped oxide (CDO), silicon nitride, silicon carbide, silicon oxynitride, organic polymers such as perfluorocyclobutane or polytetrafluoroethylene, fluorosilicate glass (FSG), and organosilicates such as silsesquioxane, siloxane, or organosilicate glass. Other materials are also possible. The dielectric layer may include pores to further reduce the dielectric constant.

Gate dielectric materials include, for example, is insulating materials, such as, silicon dioxide ($SiO_2$), silicon oxynitride ($SiO_xN_y$), silicon nitride ($Si_3N_4$), and or a high-k dielectric material. In general, a high-k dielectric is a dielectric material having a dielectric constant greater than that of $SiO_2$. The dielectric constant of $SiO_2$ is 3.9. Exemplary high-k dielectric materials include hafnium dioxide ($HfO_2$), hafnium silicon oxide, lanthanum oxide, lanthanum aluminum oxide, zirconium dioxide ($ZrO_2$), zirconium silicon oxide, titanium dioxide ($TiO_2$), tantalum pentaoxide ($Ta_2O_5$), barium strontium titanium oxide, barium titanium oxide, strontium titanium oxide, yttrium oxide, aluminum oxide, lead scandium tantalum oxide, lead zinc niobate, and other materials known in the semiconductor art. Gate electrode materials include, for example, materials such as Ti, W, Ta, Al, and alloys thereof, and alloys with rare earth elements, such as Er, Dy or noble metals such as Pt, and nitrides such as TaN, and TiN.

Individual transistors shown herein may comprise additional structures, such as insulating layers enclosing the transistor, metal trenches and vias connecting sources and drains to other components, and other additional layers and or components. Components illustrated as one layer for simplicity, can comprise a plurality of layers of the same or a different material depending, for example, on the manufacturing processes employed in constructing the device and the desired properties of the device.

Embodiments of the invention can be made using standard semiconductor processing techniques. Source and drain regions comprising a doped III-V compound semiconductor material are made, for example, using MBE (molecular beam epitaxy), CVD (chemical vapor deposition), MOVPE (metalorganic vapor phase epitaxy), MOCVD (metal organic chemical vapor deposition), RTCVD (rapid thermal chemical vapor deposition), or UHV-CVD (ultra high-vacuum chemical vapor deposition).

Typically, the transistor structures of FIGS. 1A-B through FIGS. 4A-B are a part of and integrated into an integrated circuit chip, the components of which are not shown for clarity of illustration. Implementations of the invention are housed on a substrate, such as a semiconductor substrate. Substrates on which transistor structures according to embodiments of the invention can be formed include, for example, H-terminated silicon, silicon dioxide, silicon, silicon germanium, a group III-V (or a group 13-14 in additional periodic table column numbering schemes) compound semiconductor, a main-group oxide, a metal, and or a binary or mixed metal oxide. Additional layers and/or layers comprising devices can also be described as the substrate or part of the substrate on which embodiments of the invention are fabricated. The substrate base on which semiconductor devices are built is typically a semiconductor wafer that is diced apart to yield individual IC chips. The base substrate on which a chip is built is typically a silicon wafer, although embodiments of the invention are not dependent on the type of substrate used. The substrate could also be comprised of germanium, indium antimonide, lead telluride, indium arsenide, indium phosphide, gallium arsenide, gallium antimonide, and or other group III-V materials either alone or in combination with silicon or silicon dioxide or other insulating materials.

Figure 5:
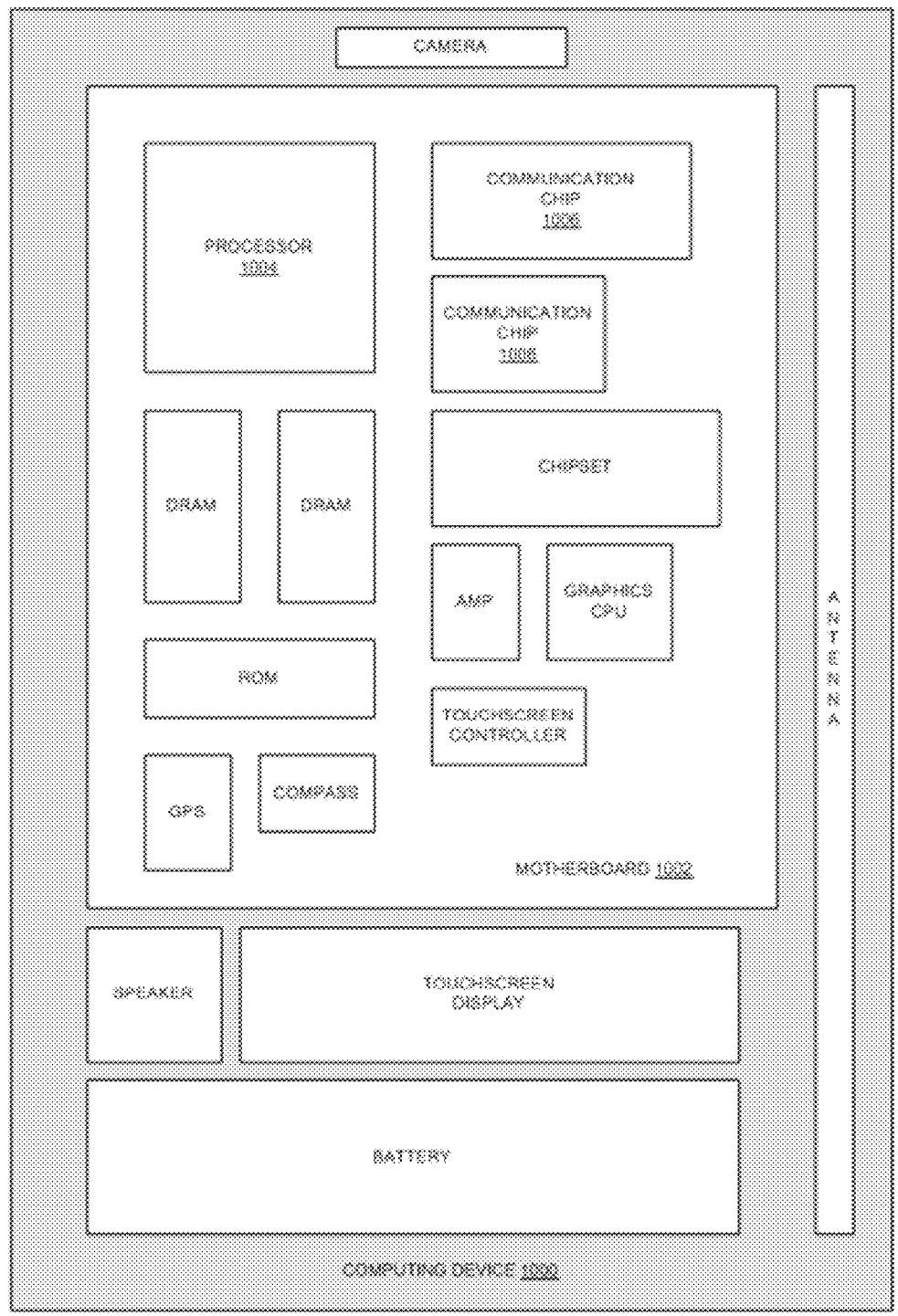
FIG. 5 is a computing device built in accordance with an implementation of the invention.

FIG. 5 illustrates a computing device 1000 in accordance with an implementation of the invention. The computing device 1000 houses a motherboard 1002. The motherboard 1002 may include a number of components, including but not limited to a processor 1004 and at least one communication chip 1006. The processor 1004 is physically and electrically coupled to the motherboard 1002. In some implementations the at least one communication chip 1006 is also physically and electrically coupled to the motherboard 1002.

Depending on its applications, computing device 1000 may include other components that may or may not be physically and electrically coupled to the motherboard 1002. These other components include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more devices, such as transistors, that are formed in accordance with implementations of the invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip includes one or more devices, such as transistors, that are formed in accordance with implementations of the invention.

In further implementations, another component housed within the computing device 1000 may contain an integrated circuit die that includes one or more devices, such as transistors, that are formed in accordance with implementations of the invention.

In various implementations, the computing device 1000 may be a laptop, a netbook, a notebook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that, processes data.

In the previous description, numerous specific details are set forth, such as layouts for transistors and material regimes, in order to provide a thorough understanding of embodiments of the present invention. It will be apparent to one skilled in the art that embodiments of the present invention may be practiced without these specific details. In other instances, well-known features, such as electrical connection schemes for transistors and integrated circuit design layouts, are not described in detail in order to not unnecessarily obscure embodiments of the present invention. Furthermore, it is to be understood that the various embodiments shown in the Figures are illustrative representations and are not necessarily drawn to scale.

Persons skilled in the relevant art appreciate that modifications and variations are possible throughout the disclosure and combinations and substitutions for various components shown and described. Reference throughout this specification to "one embodiment" or "an embodiment" means that a particular feature, structure, material, or characteristic described in connection with the embodiment is included in at least one embodiment of the invention, but does not necessarily denote that they are present in every embodiment. Furthermore, the particular features, structures, materials, or characteristics disclosed in the embodiments may be combined in any suitable manner in one or more embodiments. Various additional layers and/or structures may be included and/or described features may be omitted in other embodiments.

We claim:

1. A device comprising:
    a substrate comprising a source and a drain region, wherein the source and the drain region comprise a doped III-V compound semiconductor material wherein the doped III-V compound semiconductor material comprises one or more elements from group III of the periodic table and one or more elements from group V of the periodic table,
    a channel region between the source and the drain region wherein a first end of the channel region abuts the source region and a second end of the channel region abuts the drain region wherein the doped III-V compound semiconductor material of the source and the drain regions creates strain in the channel region, and
    a gate dielectric material disposed on three sides of the channel region and a gate electrode material disposed on the gate dielectric.

2. The device of claim 1 wherein the channel region comprises germanium.

3. The device of claim 1 wherein the channel region comprises a combination of germanium and silicon or a combination of germanium, silicon, and tin.

4. The device of claim 1 wherein the channel region comprises silicon.

5. The device of claim 1 wherein the one or more elements from group III of the periodic table are selected from the group consisting of B, Al, Ga, and In, and the one or more elements from group V of the periodic table are selected from the group consisting of P, As, and Sb.

6. The device of claim 1 wherein the source and the drain region comprise $Al_xIn_{1-x}P$, wherein $0.5<x<0.8$, $Ga_xIn_{1-x}P$, wherein $0.5<x<0.8$, $GaSb_xP_{1-x}$, wherein $0.1<x<0.3$, $AlSb_xP_{1-x}$, wherein $0.1<x<0.3$, $AlAs_xP_{1-x}$, wherein $0.5<x<1$, or $GaAs_xP_{1-x}$, where $0.5<x<1$.

7. The device of claim 1 wherein the source and the drain region comprise $Al_xIn_{1-x}P$, wherein x is between 0.2 and 0.5, $Ga_xIn_{1-x}P$, wherein x is between 0.2 and 0.5, $Ga_xIn_{1-x}As$, wherein x is between 0.7 and 1, $Al_xIn_{1-x}P$, wherein x is between 0.7 and 1, $GaSb_xP_{1-x}$, wherein x is between 0.3 and 0.5, $AlSb_xP_{1-x}$, wherein x is between 0.3 and 0.5, $GaAs_xSb_{1-x}$, wherein x is between 0.75 and 1, or $AlAs_xSb_{1-x}$, wherein x is between 0.75 and 1.

8. The device of claim 1 wherein the channel region is tensely strained.

9. The device of claim 1 wherein the channel region is compressively strained.

10. The device of claim 1 wherein the source and drain regions are doped with germanium, carbon, silicon, magnesium, beryllium, manganese, or zinc.

11. A computing device comprising:
    a motherboard;
    a communication chip mounted on the motherboard; and
    a processor mounted on the motherboard, the processor comprising a transistor, the transistor comprising:
    a substrate comprising a source and a drain region, wherein the source and the drain region comprise a III-V compound semiconductor material, wherein the III-V compound semiconductor material comprises one or more elements from group III of the periodic table and one or more elements from group V of the periodic table,
    a channel region between the source and the drain region wherein a first end of the channel region abuts the source region and a second end of the channel region abuts the drain region wherein the doped III-V compound semiconductor material of the source and the drain regions creates strain in the channel region, and
    a gate dielectric material disposed on three sides of the channel region and a gate electrode material disposed on the gate dielectric.

12. The device of claim 11 wherein the one or more elements from group III of the periodic table are selected from the group consisting of B, Al, Ga, and In, and the one or more elements from group V of the periodic table are selected from the group consisting of P, As, and Sb.

13. The device of claim 11 wherein the source and the drain region comprise $Al_xIn_{1-x}P$, wherein $0.5<x<0.8$, $Ga_xIn_{1-x}P$, wherein $0.5<x<0.8$, $GaSb_xP_{1-x}$, wherein $0.1<x<0.3$, $AlSb_xP_{1-x}$, wherein $0.1<x<0.3$, $AlAs_xP_{1-x}$, wherein $0.5<x<1$, or $GaAs_xP_{1-x}$, where $0.5<x<1$.

14. The device of claim 11 wherein the source and the drain region comprise $Al_xIn_{1-x}P$, wherein x is between 0.2 and 0.5, $Ga_xIn_{1-x}P$, wherein x is between 0.2 and 0.5, $Ga_xIn_{1-x}As$, wherein x is between 0.7 and 1, $Al_xIn_{1-x}P$, wherein x is between 0.7 and 1, $GaSb_xP_{1-x}$, wherein x is between 0.3 and 0.5, $AlSb_xP_{1-x}$, wherein x is between 0.3 and 0.5, $GaAs_xSb_{1-x}$, wherein x is between 0.75 and 1, or $AlAs_xSb_{1-x}$, wherein x is between 0.75 and 1.

15. A device comprising:
    a substrate comprising a source and a drain region, wherein the source and the drain region comprise $Al_xIn_{1-x}P$, wherein $0.5<x<0.8$, $Ga_xIn_{1-x}P$, wherein $0.5<x<0.8$, $GaSb_xP_{1-x}$, wherein $0.1<x<0.3$, $AlSb_xP_{1-x}$, wherein $0.1<x<0.3$, $AlAs_xP_{1-x}$, wherein $0.5<x<1$, or $GaAs_xP_{1-x}$, where $0.5<x<1$, a channel region between the source and the drain region wherein a first end of the channel region abuts the source region and a second end of the channel region abuts the drain region, and a gate dielectric material disposed on three sides of the channel region and a gate electrode material disposed on the gate dielectric.

16. The device of claim 15 wherein the channel region comprises germanium.

17. The device of claim 15 wherein the channel region comprises a combination of germanium and silicon or a combination of germanium, silicon, and tin.

18. The device of claim 15 wherein the channel region comprises silicon.

19. The device of claim 15 wherein the channel region is tensely strained.

20. The device of claim 15 wherein the source and drain regions are doped with germanium, carbon, silicon, magnesium, beryllium, manganese, or zinc.

21. A device comprising:
a substrate comprising a source and a drain region, wherein the source and the drain region comprise $Al_xIn_{1-x}P$, wherein x is between 0.2 and 0.5, $Ga_xIn_{1-x}P$, wherein x is between 0.2 and 0.5, $Ga_xIn_{1-x}As$, wherein x is between 0.7 and 1, $Al_xIn_{1-x}P$, wherein x is between 0.7 and 1, $GaSb_xP_{1-x}$, wherein x is between 0.3 and 0.5, $AlSb_xP_{1-x}$, wherein x is between 0.3 and 0.5, $GaAs_xSb_{1-x}$, wherein x is between 0.75 and 1, or $AlAs_xSb_{1-x}$, wherein x is between 0.75 and 1, a channel region between the source and the drain region wherein a first end of the channel region abuts the source region and a second end of the channel region abuts the drain region, and a gate dielectric material disposed on three sides of the channel region and a gate electrode material disposed on the gate dielectric.

22. The device of claim 21 wherein the channel region comprises germanium.

23. The device of claim 21 wherein the channel region comprises a combination of germanium and silicon or a combination of germanium, silicon, and tin.

24. The device of claim 21 wherein the channel region comprises silicon.

25. The device of claim 21 wherein the channel region is compressively strained.

26. The device of claim 21 wherein the source and drain regions are doped with germanium, carbon, silicon, magnesium, beryllium, manganese, or zinc.

* * * * *